(12) United States Patent
Singh et al.

(10) Patent No.: US 10,685,703 B2
(45) Date of Patent: Jun. 16, 2020

(54) TRANSISTOR BODY BIAS CONTROL CIRCUIT FOR SRAM CELLS

(71) Applicant: NXP B.V., Eindhoven (NL)

(72) Inventors: Jainendra Singh, Bangalore (IN); Sushikha Jain, Uttar Pradesh (IN); Deepti Saini, Bangalore (IN); Jwalant Kumar Mishra, Bangalore (IN); Patrick Van de Steeg, Oss (NL)

(73) Assignee: NXP B.V., San Jose, CA (US)

(*) Notice: Subject to any disclaimer, the term of this patent is extended or adjusted under 35 U.S.C. 154(b) by 0 days.

(21) Appl. No.: 16/129,718

(22) Filed: Sep. 12, 2018

(65) Prior Publication Data
US 2020/0082876 A1   Mar. 12, 2020

(51) Int. Cl.
| | | |
|---|---|---|
| G11C 8/08 | (2006.01) | |
| G11C 7/12 | (2006.01) | |
| G11C 11/419 | (2006.01) | |
| G11C 7/18 | (2006.01) | |
| G11C 8/14 | (2006.01) | |
| G11C 11/412 | (2006.01) | |
| H01L 27/11 | (2006.01) | |
| G11C 5/14 | (2006.01) | |

(52) U.S. Cl.
CPC ............. *G11C 11/419* (2013.01); *G11C 7/12* (2013.01); *G11C 7/18* (2013.01); *G11C 8/08* (2013.01); *G11C 8/14* (2013.01); *G11C 11/412* (2013.01); *H01L 27/11* (2013.01); *G11C 5/147* (2013.01)

(58) Field of Classification Search
CPC .................................. G11C 8/08; G11C 7/08
USPC ............................................ 365/189.09, 205
See application file for complete search history.

(56) References Cited

U.S. PATENT DOCUMENTS

| | | | |
|---|---|---|---|
| 5,084,873 A * | 1/1992 | Houston | G11C 8/20 250/370.07 |
| 6,272,039 B1 * | 8/2001 | Clemens | G11C 11/412 365/149 |
| 6,484,265 B2 | 11/2002 | Borkar et al. | |
| 6,566,914 B2 | 5/2003 | Bruneau et al. | |
| 6,593,799 B2 | 7/2003 | De et al. | |
| 7,681,628 B2 | 3/2010 | Joshi et al. | |
| 8,004,907 B2 | 8/2011 | Russell et al. | |
| 8,018,780 B2 | 9/2011 | Houston et al. | |
| 9,583,178 B2 | 2/2017 | Jung et al. | |

(Continued)

FOREIGN PATENT DOCUMENTS

JP        2013-254548 A    12/2013

*Primary Examiner* — Michael T Tran

(57) ABSTRACT

A semiconductor memory circuit includes a SRAM cell and a bias control circuit for biasing the SRAM cell. The SRAM cell includes pull-up, pull-down, and pass-gate transistors. The bias control circuit is connected to body terminals of the pull-down and pass-gate transistors for providing a bias voltage. The bias control circuit controls threshold voltages of the pull-down and pass-gate transistors by way of the bias voltage. The bias voltage, which is temperature dependent, is generated based on junction leakages at the body terminals of the pull-down and pass-gate transistors. The use of a temperature-dependent bias voltage to bias the body terminals of the pull-down and pass-gate transistors ensures that the write margin and the static noise margin (SNM) of the SRAM cell are relatively constant and above acceptable levels over a defined temperature range.

16 Claims, 4 Drawing Sheets

(56) References Cited

U.S. PATENT DOCUMENTS

| | | |
|---|---|---|
| 9,818,460 B2 | 11/2017 | Kolar et al. |
| 9,865,333 B2 | 1/2018 | Dhori et al. |
| 9,875,788 B2 | 1/2018 | Jung |
| 10,431,300 B2* | 10/2019 | Pyo .................. G11C 13/0028 |
| 2003/0043640 A1 | 3/2003 | Marr et al. |
| 2005/0213370 A1 | 9/2005 | Khellah et al. |
| 2006/0226889 A1 | 10/2006 | Gupta et al. |
| 2007/0097756 A1* | 5/2007 | Hirota .................. G11C 11/417 365/189.09 |
| 2007/0121358 A1 | 5/2007 | Hirota et al. |
| 2008/0080235 A1* | 4/2008 | Tran ...................... G11C 7/065 365/185.03 |
| 2009/0080276 A1* | 3/2009 | Cai .................. H03K 19/0016 365/212 |
| 2010/0254199 A1* | 10/2010 | Houston .............. G11C 7/1051 365/189.05 |
| 2011/0063895 A1* | 3/2011 | Komatsu .............. G11C 11/413 365/156 |
| 2011/0089419 A1* | 4/2011 | Yamazaki ......... H01L 27/10873 257/43 |
| 2012/0081975 A1 | 4/2012 | Yamaki |
| 2012/0170391 A1* | 7/2012 | Janardan .................. G11C 7/04 365/194 |
| 2013/0286718 A1* | 10/2013 | Krilic .................. G11C 11/412 365/154 |
| 2014/0191338 A1* | 7/2014 | Nii ...................... H01L 27/0207 257/401 |
| 2016/0042791 A1* | 2/2016 | Sakui .................. G11C 16/0483 365/185.05 |
| 2016/0267980 A1* | 9/2016 | Akamine ............ G11C 16/0483 |
| 2016/0379710 A1* | 12/2016 | Sekar .................. G11C 13/0028 365/148 |
| 2017/0069659 A1* | 3/2017 | Kawasumi ........ H01L 27/11807 |
| 2017/0092367 A1* | 3/2017 | Lee ........................ G11C 16/14 |
| 2017/0148519 A1* | 5/2017 | Jin ........................ G11C 16/10 |
| 2017/0278555 A1* | 9/2017 | Su ............................ G11C 7/12 |
| 2017/0301395 A1 | 10/2017 | Clark et al. |
| 2017/0351802 A1* | 12/2017 | Chang .................. G06F 17/5077 |
| 2018/0061486 A1* | 3/2018 | Itoh ........................ G11C 11/417 |
| 2018/0114567 A1* | 4/2018 | Tang ...................... G11C 5/147 |
| 2018/0366205 A1* | 12/2018 | Heinrich-Barna ..... G11C 17/08 |
| 2019/0019550 A1* | 1/2019 | Chevallier ............ G11C 11/418 |
| 2019/0066748 A1* | 2/2019 | Lee ...................... G11C 11/1673 |
| 2019/0067375 A1* | 2/2019 | Karda ............... H01L 29/42392 |
| 2019/0088327 A1* | 3/2019 | Ito ........................ H01L 43/12 |
| 2019/0109193 A1* | 4/2019 | Liaw ................... H01L 29/165 |
| 2019/0198098 A1* | 6/2019 | Yang .................. G11C 13/0033 |
| 2019/0244641 A1* | 8/2019 | Jamali ................ G11C 11/4091 |
| 2019/0296734 A1* | 9/2019 | Yokoyama ........... G11C 11/418 |
| 2019/0333575 A1* | 10/2019 | Hoefler ................ G11C 11/412 |
| 2019/0334080 A1* | 10/2019 | Ahmed ............... H01F 10/3254 |
| 2019/0378575 A1* | 12/2019 | Lu .......................... G11C 16/22 |
| 2020/0075081 A1* | 3/2020 | Hush .................... G11C 7/1006 |
| 2020/0105314 A1* | 4/2020 | Yu .............................. G11C 7/08 |
| 2020/0105315 A1* | 4/2020 | Chang ................ G11C 13/0026 |
| 2020/0135260 * | 4/2020 | Venkata ............. G11C 11/4091 |

* cited by examiner

TRANSISTOR BODY BIAS CONTROL CIRCUIT FOR SRAM CELLS

BACKGROUND

The present invention relates generally to memory circuits, and more particularly, to a read and write assist circuit for a static random access memory (SRAM) cell.

A semiconductor memory circuit stores data electronically. One type of memory circuit is a SRAM, which is made up of an array of SRAM cells. The SRAM cells retain data in a static form. An SRAM cell typically includes pull-up and pull-down transistors, pass-gate transistors, bit lines, and a word line. Threshold voltages of the pull-up, pull-down, and pass-gate transistors determine a static noise margin (SNM) and a write margin (i.e. stability of read and write operations, respectively) of the SRAM cell. However, as semiconductor device sizes shrink, fluctuations in the threshold voltages increase due to random dopant fluctuation (RDF), line edge roughness (LER), and short channel effects (SCE). These fluctuations in the threshold voltages result in fluctuations in the drive strengths of the transistors, which degrades the SNM and the write margin.

A conventional approach to reduce the degradation of the SNM and the write margin is to use a read and write assist circuit. A read assist circuit ensures an adequate SNM by decreasing the drive strengths of the pass-gate transistors or increasing the drive strengths of the pull-up transistors. On the other hand, a write assist circuit ensures an adequate write margin by increasing the drive strengths of the pass-gate transistors or decreasing the drive strengths of the pull-up transistors. These conflicting drive-strength requirements make it difficult to achieve both an adequate SNM and an adequate write margin at the same time. Further, the read assist technique degrades the read current of the SRAM cell, which affects its speed, whereas the write assist technique increases power consumption.

The SNM and the write margin of the SRAM cell are further dependent on temperature. The SNM degrades at high temperatures, while the write margin degrades at low temperatures. Thus, an improvement in the SNM results in degradation in the write margin, and vice-versa.

The read and write assist circuits may use biasing techniques along with the read and write assist techniques. The biasing techniques include generating a bias voltage that is provided to body terminals of the transistors in the SRAM cells. The biasing techniques may be implemented with biasing circuits that include various combinations of transistors, resistors, diodes, and the like. However, employing the biasing circuits consumes additional area and power.

Therefore, it would be advantageous to have a read and write assist circuit for an SRAM cell that maintains an SNM and a write margin above an acceptable level over a temperature range and increases the operational speed of the SRAM cell.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
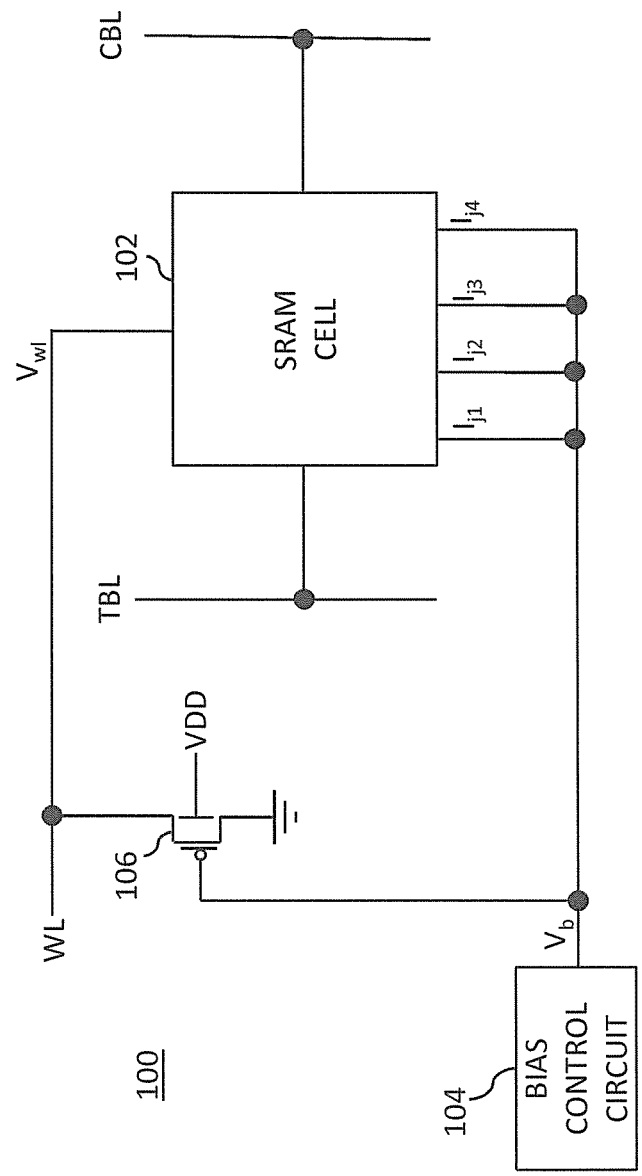
FIG. 1 is a schematic block diagram of a semiconductor memory circuit in accordance with an embodiment of the present invention.

The detailed description of the appended drawings is intended as a description of the currently preferred embodiments of the present invention and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a semiconductor memory circuit that includes a memory cell and a bias control circuit for biasing the memory cell. The memory cell includes a first plurality of transistors. The bias control circuit is connected to body terminals of the first plurality of transistors and provides a bias voltage to control threshold voltages of the first plurality of transistors. The bias voltage, which is temperature dependent, is generated based on junction leakages at the body terminals.

In another embodiment, the present invention provides a method for biasing a memory cell. The method includes generating a temperature-dependent bias voltage by a bias control circuit, where the bias voltage is generated based on junction leakages at body terminals of a first plurality of transistors of the memory cell. The method further includes providing the bias voltage to the body terminals to control threshold voltages of the first plurality of transistors.

Various embodiments of the present invention provide a semiconductor memory circuit. The semiconductor memory circuit includes a memory cell, a bias control circuit for biasing the memory cell, and a word line (WL) connected to the memory cell. The memory cell is a SRAM memory cell that includes a first plurality of transistors including a plurality of pull-down transistors and at least one pass-gate transistor. The memory cell further includes a second plurality of transistors that includes a plurality of pull-up transistors. The bias control circuit is connected to body terminals of the first plurality of transistors for providing a bias voltage to control threshold voltages of the first plurality of transistors. The bias voltage is generated based on junction leakages at the body terminals and is temperature-dependent. The bias control circuit provides the bias voltage to a third transistor that is connected to the WL and the bias control circuit. The third transistor controls a WL voltage of the WL based on the bias voltage. The bias control circuit regulates a write margin and an operational speed of the memory cell by controlling the threshold voltages of the first plurality of transistors.

In one embodiment, the bias control circuit is a transistor-based diode. The use of the transistor-based diode as a bias control circuit to assist in read and write operations of the memory cell ensures that the bias control circuit occupies less area than biasing circuits of conventional memory circuits. Thus, an overall area occupied by the semiconductor memory circuit is considerably less than the area required by semiconductor memory circuits that include conventional biasing circuits. Further, as the bias control circuit controls the threshold voltages of the first plurality of transistors by providing the bias voltage to body terminals of the transistors, the SNM and a write margin of the memory cell are relatively constant and are above acceptable levels, over a temperature range. Further, the control of the threshold voltages of the first plurality of transistors ensures that the memory cell operates at a faster speed than conventional memory cells, especially at low temperatures.

Referring now to FIG. 1, a schematic block diagram of a semiconductor memory circuit 100 in accordance with an embodiment of the present invention is shown. The memory circuit 100 is an electronic data storage device on an integrated circuit (IC) (not shown). The memory circuit 100 includes a static random access memory (SRAM) cell 102, a bias control circuit 104, and a first transistor 106. In one embodiment, the bias control circuit 104 is a transistor-based diode. The transistor-based diode corresponds to one or more transistors connected to form a diode. The memory circuit 100 further includes a word line WL, a true bit line TBL, and a complementary bit line CBL.

The SRAM cell 102 is connected to the word line WL for receiving a word line voltage $V_{wl}$. A word line voltage generation circuit (not shown) generates the word line voltage $V_{wl}$ and provides the word line voltage $V_{wl}$ to the word line WL by way of a word line driver (shown in FIGS. 2 and 3). The SRAM cell 102 also is connected to the true and complementary bit lines TBL and CBL. During a write operation, the true and complementary bit lines TBL and CBL in conjunction with the word line WL, write data to the SRAM cell 102. During a read operation, the true and complementary bit lines TBL and CBL in conjunction with the word line WL, read the data from the SRAM cell 102. The data written to or read from the SRAM cell 102 will correspond to a logical '0' or a logical '1'. Although the SRAM cell 102 is shown in the drawings as a six-transistor (6T) SRAM cell, it will be understood by those of skill in the art that the invention is not limited to a 6T SRAM cell. For example, the invention may comprise a five-transistor (5T) SRAM cell, a six-transistor (6T) SRAM cell, a seven-transistor (7T) SRAM cell, an eight-transistor (8T) SRAM cell, and a nine-transistor (9T) SRAM cell.

The bias control circuit 104 is connected to the SRAM cell 102 and receives leakage currents that are generated at body terminals of a first plurality of transistors of the SRAM cell 102 (shown in FIG. 2 and discussed in more detail below). The leakage currents correspond to junction leakages generated at the body terminals of the transistors of the first plurality of transistors. A junction leakage may be generated due to various short-channel effects, distance between the transistors, and the like. The junction leakages also generate biasing voltages. The bias control circuit 104 generates the bias voltage $V_b$ based on the junction leakages in the SRAM cell 102, and provides the bias voltage $V_b$ to the SRAM cell 102. The bias voltage $V_b$ is temperature-dependent, i.e., at a low temperature (e.g., −40° C.), the bias voltage $V_b$ is at a higher voltage level than when the temperature is higher (e.g., 150° C.). That is, $V_b$ at a low temperature $>V_b$ at a high temperature.

The bias control circuit 104 functions as a read and write assist circuit for the SRAM cell 102. The bias control circuit 104 assists in the read and write operations of the SRAM cell 102, which improves the SNM and write margin, respectively, of the SRAM cell 102. The SNM determines read stability of the SRAM cell 102. The SNM is a maximum noise that can be tolerated in the SRAM cell 102 during the read operation. The write margin determines write-ability of the SRAM cell 102. The write margin is defined as a minimum voltage on the true and complementary bit lines TBL and CBL that is required to flip a state of the data stored in the SRAM cell 102, for example to flip from a logical '0' to a logical '1'.

The first transistor 106 has a gate terminal connected to the bias control circuit 104 for receiving the bias voltage $V_b$, a source terminal connected to the word line WL for receiving the word line voltage $V_{wl}$, a body terminal connected to a power supply for receiving a supply voltage VDD, and a drain terminal connected to ground. The first transistor 106 controls the word line voltage $V_{wl}$ based on the bias voltage $V_b$ generated by the bias control circuit 104. In one embodiment, the first transistor 106 is a PMOS transistor.

The word line WL is connected to a word line driver for receiving the word line voltage $V_{wl}$. The word line WL is asserted during the read and write operations of the SRAM cell 102. When the word line WL is asserted, the word line voltage $V_{wl}$ is high. In one embodiment, the high voltage level corresponds to a voltage level of the supply voltage VDD.

The true and complementary bit lines TBL and CBL write the data into the SRAM cell 102 during the write operation when the word line WL is asserted. During the read operation, the true and complementary bit lines TBL and CBL are precharged to the voltage level of the supply voltage VDD for reading the stored data from the SRAM cell 102 when the word line WL is asserted.

It will be apparent to a person skilled in the art that the memory circuit 100 may include multiple SRAM cells arranged in rows and columns, multiple word lines for each row, and multiple true and complementary bit lines, for each column. The memory circuit 100 may further include multiple copies of the first transistor 106, connected to the corresponding word lines. The bias control circuit 104 may be connected to just one SRAM cell 102, all of the SRAM cells in an array, or just to a row of SRAM cells in an array of SRAM cells.

Figure 2:
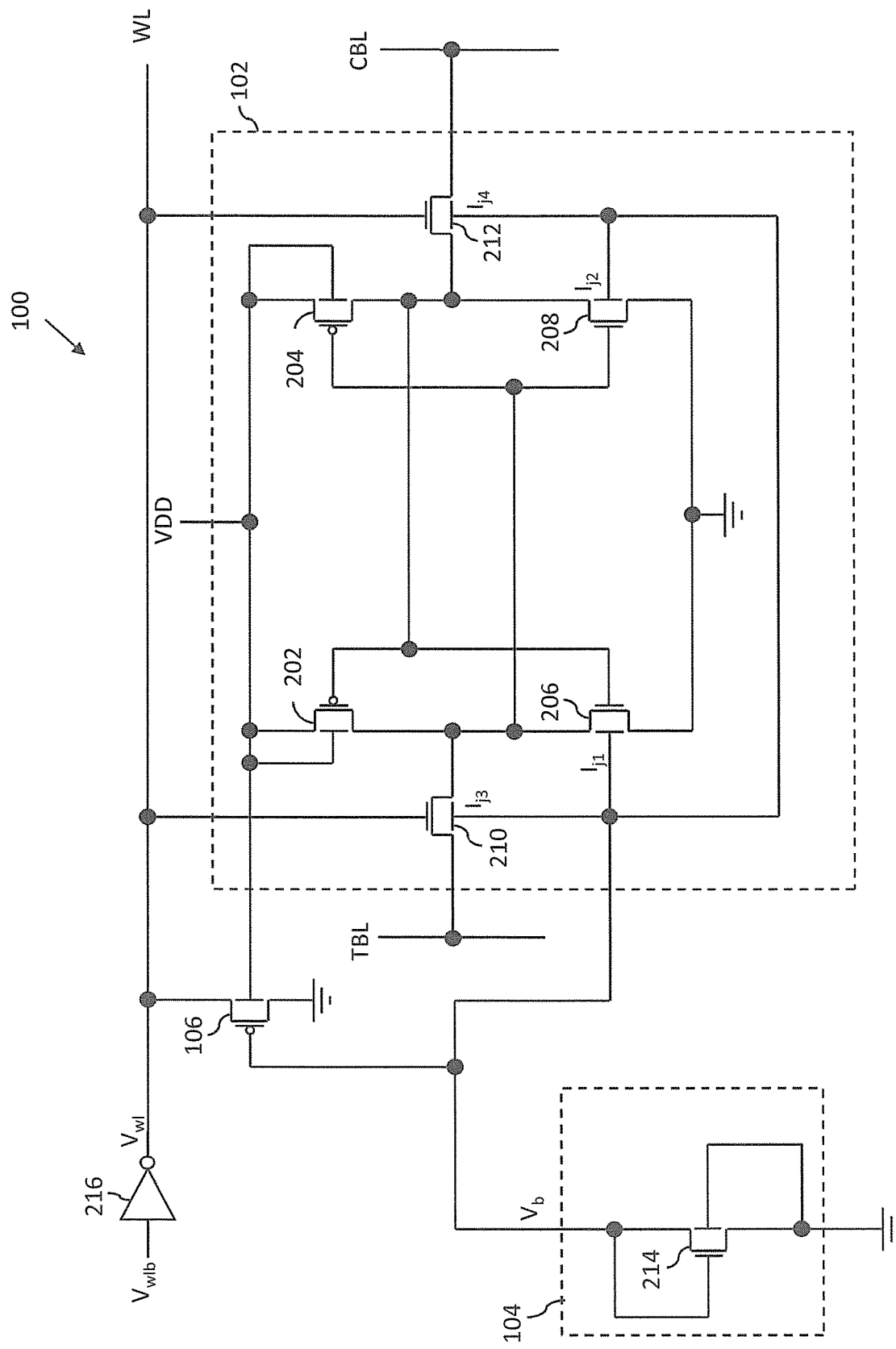
FIG. 2 is a schematic circuit diagram of the semiconductor memory circuit of FIG. 1 in accordance with an embodiment of the present invention.

Referring now to FIG. 2, a schematic circuit diagram of the memory circuit 100 in accordance with an embodiment of the present invention is shown. The SRAM cell 102 includes first and second pluralities of transistors, where the first plurality of transistors includes second and third pull-down transistors 206 and 208 and second and third pass-gate transistors 210 and 212, and the second plurality of transistors includes second and third pull-up transistors 202 and 204. The bias control circuit 104 includes a fourth transistor 214.

The second and third pull-up transistors 202 and 204 have their source and body terminals connected together and to the power supply for receiving the supply voltage VDD. The second pull-down transistor 206 has a drain terminal connected to a drain terminal of the second pull-up transistor 202, a gate terminal connected to a gate terminal of the second pull-up transistor 202, and a source terminal connected to ground. Thus, the second pull-up and second pull-down transistors 202 and 206 form a first complementary metal-oxide semiconductor (CMOS) inverter. In one embodiment, the second pull-up transistor 202 is a PMOS transistor and the second pull-down transistor 206 is an NMOS transistor. The third pull-down transistor 208 has a drain terminal connected to a drain terminal of the third pull-up transistor 204, a gate terminal connected to a gate terminal of the third pull-up transistor 204, and a source terminal connected to ground. In one embodiment, the third pull-up transistor 204 is a PMOS transistor and the third pull-down transistor 208 is an NMOS transistor. Thus, the third pull-up and third pull-down transistors 204 and 208 form a second CMOS inverter.

In addition, the gates of the second pull-up and pull-down transistors 202 and 206 are connected drains of the third pull-up and pull-down transistors 204 and 208, while the gates of the third pull-up and pull-down transistors 204 and 208 are connected to the drains of the second pull-up and pull-down transistors 202 and 206. Thus, an output of the first CMOS inverter is provided as an input to the second CMOS inverter, and vice versa. The first and second CMOS inverters thus are cross-coupled inverters that form a latch circuit, which acts as a storage element of the SRAM cell 102.

The third pull-down transistor 208 further has a body terminal connected to a body terminal of the second pull-down transistor 206.

The second pass-gate transistor 210 has a gate terminal connected to the word line WL for receiving the word line voltage $V_{w1}$, a body terminal connected to the body terminals of the second and third pull-down transistors 206 and 208, a first terminal connected to the drain terminals of the second pull-up and second pull-down transistors 202 and 206, and a second terminal connected to the true bit line TBL. During a read operation, the first and second terminals of the second pass-gate transistor 210 are source and drain terminals, respectively, and during a write operation, the first and second terminals of the second pass-gate transistor 210 are drain and source terminals, respectively.

The third pass-gate transistor 212 has a gate terminal connected to the word line WL for receiving the word line voltage $V_{w1}$, a body terminal connected to the body terminals of the second and third pull-down transistors 206 and 208 and the second pass-gate transistor 210, a third terminal connected to the drain terminals of the third pull-up and third pull-down transistors 204 and 208, and a fourth terminal connected to the complementary bit line CBL. During a read operation, the third and fourth terminals of the third pass-gate transistor 212 are source and drain terminals, respectively, and during a write operation, the third and fourth terminals of the third pass-gate transistor 212 are drain and source terminals, respectively.

The fourth transistor 214 is a diode-connected transistor. In one embodiment, the fourth transistor 214 is an NMOS transistor. The fourth transistor 214 has source and body terminals connected to ground, and drain and gate terminals connected to the body terminals of the transistors of the first plurality of transistors (e.g., transistors 206, 208, 210 and 212) to receive the leakage currents respectively. The leakage currents correspond to the junction leakages generated at the body terminals of the transistors of the first plurality of transistors. It is noted that the accumulation of junction leakages will create junction voltages (Vj1-Vj4). Based on the junction leakages, the fourth transistor 214 generates the bias voltage $V_b$. The fourth transistor 214 provides the bias voltage $V_b$ to the body terminals of the first plurality of transistors 206-212 to control threshold voltages of the transistors 206-212. A threshold voltage of a transistor is a voltage at which the transistor is activated.

The drain and gate terminals of the fourth transistor 214 further are connected to the gate of the first transistor 106 for providing the bias voltage $V_b$ thereto. The first transistor 106 is activated or deactivated based on the bias voltage $V_b$.

When the bias voltage $V_b$ increases, the threshold voltages of the first plurality of transistors 206-212 decreases, thereby increasing drive strengths of the transistors 206-212. When the bias voltage $V_b$ decreases, the threshold voltages of the first plurality of transistors 206-212 increases, thereby decreasing the drive strengths of the transistors 206-212.

The bias voltage $V_b$ is temperature-dependent. For high temperatures (such as 100° C. to 150° C.), the bias voltage $V_b$ is at a first voltage level and for low temperatures (such as −50° C. to −10° C.), the bias voltage $V_b$ is at a second voltage level that is higher than the first voltage level. In one embodiment, the first voltage level is approximately equal to ground, and the second voltage level is significantly greater than ground (i.e., in a range of 100 millivolts (mV) to 250 mV). Thus, an increase in drive strengths of the transistors 206-212 at the first voltage level of the bias voltage $V_b$ is less than the increase in drive strengths of the transistors 206-212 at the second voltage level of the bias voltage $V_b$.

The memory circuit 100 further includes a word line driver 216 that drives the word line WL. In one embodiment, the word line driver 216 is a CMOS inverter. The word line driver 216 is connected to the word line WL and provides the word line voltage $V_{w1}$ to the memory cell 102. The word line driver 216 outputs the word line voltage $V_{w1}$ when the word line driver 216 receives an inverted version of the word line voltage $V_{w1b}$ from the word line voltage generation circuit.

During a write operation, the word line WL is asserted by the word line driver 216, and data from the true and complementary bit lines TBL and CBL is written to the storage element (i.e., the cross-coupled first and second CMOS inverters) of the SRAM cell 102 by way of the second and third pass-gate transistors 210 and 212. It will be apparent to a person skilled in the art that the write operation is similar to a write operation of a conventional SRAM cell (i.e., an SRAM cell without a read/write assist circuit).

At high temperatures, the bias voltage $V_b$ is at the first voltage level (which is approximately equal to ground). Receiving the bias voltage $V_b$ at the first voltage level, ensures that the drive strengths of the first and second pass-gate transistors 210 and 212 are greater than the drive strengths of the second and third pull-up transistors 202 and 204. Hence, the write margin at high temperatures is above an acceptable level. The acceptable level of the write margin indicates that there are no data upsets when the data is written to the SRAM cell 102. Thus, it is easier to flip the state of the data stored in the SRAM cell 102 during the write operation.

At low temperatures, the bias voltage $V_b$ is at the second voltage level (which is significantly greater than GND). On receiving the bias voltage $V_b$, the threshold voltages of the transistors 206-212 decreases, which increases the drive strengths of the transistors 206-212, such that the drive strengths of the first and second pass-gate transistors 210 and 212 are greater than the drive strengths of the second and third pull-up transistors 202 and 204. Hence, it is easier to flip the state of the data stored in the SRAM cell 102 during the write operation, which ensures that the write margin of the SRAM cell 102 is above the acceptable level even at low temperatures.

During a read operation, the word line WL is assert by the word line driver 216, and the true and complementary bit lines TBL and CBL are precharged to the voltage level of the supply voltage VDD. A sense amplifier (not shown) senses a difference between the voltage levels of the true and complementary bit lines TBL and CBL (as a voltage level of one of the true bit line TBL or the complementary bit line CBL decreases) to determine whether a logical '0' or a logical '1' is stored in the SRAM cell 102. For example, if the data stored in the SRAM cell 102 is a logical '1', the voltage level of the complementary bit line CBL decreases below the voltage level of the supply voltage VDD, while if the data stored in the SRAM cell 102 is a logical '0', the voltage level of the true bit line TBL decreases below the voltage level of the supply voltage VDD.

At low temperatures, as the bias voltage $V_b$ is at the second voltage level, the first transistor 106 is deactivated. Thus, the word line voltage $V_{w1}$ is at the voltage level of the supply voltage VDD. The gates of the second and third pass gate transistors 210 and 212 receive the word line voltage $V_{w1}$ at the voltage level of the supply voltage VDD. Due to a high word line voltage $V_{w1}$, the drive strengths of the second and third pass-gate transistors 210 and 212 are less than the drive strengths of the second and third pull-down transistors 206 and 208. Thus, the SNM at low temperatures remains above an acceptable level. The acceptable level of the SNM indicates that the read operation is a non-destructive read operation, i.e., the stored data read from the SRAM cell 102 is not corrupted.

At high temperatures, the bias voltage $V_b$ is at the first voltage level. Hence, the first transistor 106 is activated and trims the word line voltage $V_{w1}$, i.e., pulls down the voltage level of the word line voltage $V_{w1}$ to below the voltage level of the supply voltage VDD. As the word line voltage $V_{w1}$ is trimmed, the drive strengths of the second and third pass-gate transistors 210 and 212 decreases, such that the drive strengths of the second and third pass-gate transistors 210 and 212 are less than the drive strengths of the second and third pull-down transistors 206 and 208. Thus, the trimming of the word line voltage $V_{w1}$ assists in reading data from the SRAM cell 102 and ensures a non-destructive read operation, thereby ensuring that the SNM of the SRAM cell 102 is above the acceptable level at high temperatures.

Figure 3:
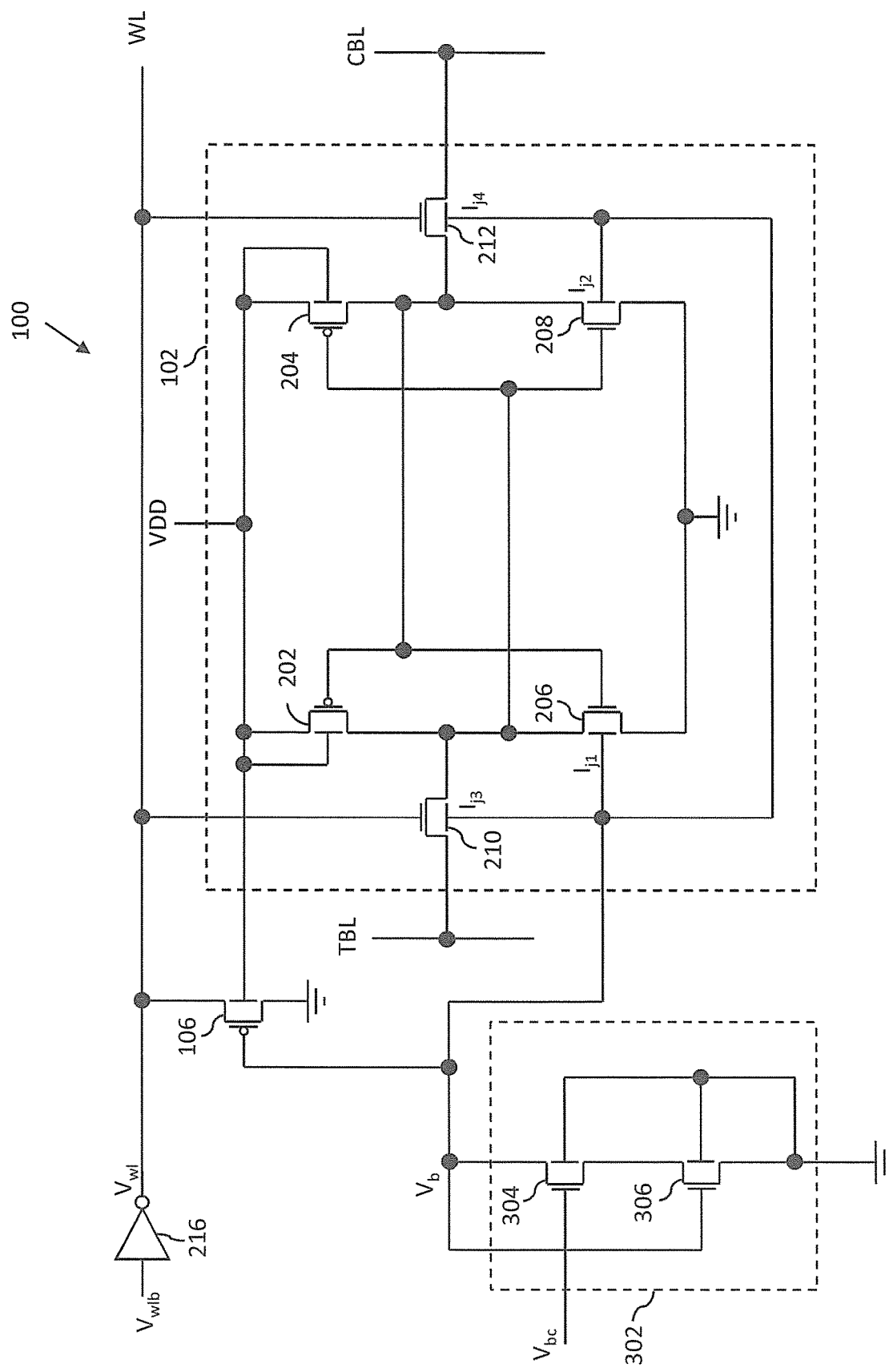
FIG. 3 is a schematic circuit diagram of the semiconductor memory circuit of FIG. 1 in accordance with another embodiment of the present invention.

Referring now to FIG. 3, a schematic circuit diagram of the memory circuit 100 in accordance with another embodiment of the present invention is shown. The memory circuit 100 includes the SRAM cell 102, the first transistor 106, the word line driver 216, and a bias control circuit 302. The operation of the SRAM cell 102, the first transistor 106, and the word line driver 216 are the same as described above with reference to FIG. 2. The difference between the embodiments of FIGS. 2 and 3 is in the bias control circuits 104 and 302. Although functionally similar, they are structurally different.

The bias control circuit 302 includes fifth and sixth transistors 304 and 306. The fifth transistor 304 has a drain connected to the body terminals of the transistors of the first plurality of transistors 206-212, and the gate terminal of the first transistor 106. The fifth transistor 304 further has a gate connected to a bias control generator (not shown) for receiving a bias control voltage $V_{bc}$, and a body terminal connected to a body terminal of the sixth transistor 406 and to ground. The fifth transistor 304 is controlled by way of the bias control voltage $V_{bc}$. The sixth transistor 306 has a drain connected to a source of the fifth transistor 304, a gate connected to the drain of the fifth transistor 304, and source and body terminals connected to ground. In one embodiment, the bias control voltage $V_{bc}$ is at a voltage level greater than a threshold voltage of the fifth transistor 304. Hence, the fifth transistor 304 is activated, and the fifth and sixth transistors 304 and 306 form diode-connected transistors. In one embodiment, the fifth and sixth transistors 304 and 306 are NMOS transistors.

It will be apparent to a person skilled in the art that examples of bias control circuits are not limited to the bias control circuits 104 and 302 that include one and two transistors, respectively. That is, the bias control circuit may include any number of transistors without deviating from the scope of the present invention.

Figure 4:
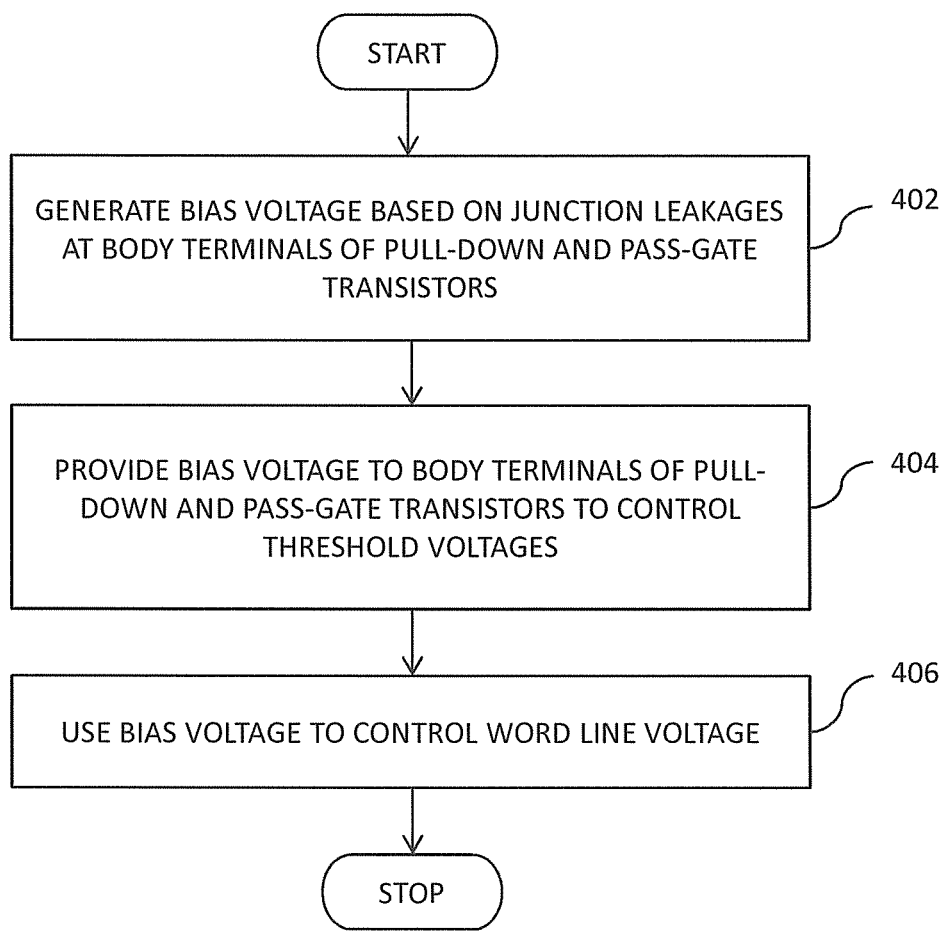
FIG. 4 is a flow chart illustrating a method for biasing a SRAM cell of the semiconductor memory circuit of FIG. 1, in accordance with an embodiment of the present invention.

Referring now to FIG. 4, a flow chart illustrating a method for biasing the SRAM cell 102 in accordance with an embodiment of the present invention is shown. At step 402, the bias control circuit 104 generates the bias voltage $V_b$ based on the junction leakages at the body terminals of the first plurality of transistors 206-212. At step 404, the bias control circuit 104 provides the bias voltage $V_b$ to the body terminals of the first plurality of transistors 206-212 to control the threshold voltages of the corresponding transistors. At step 406, the bias control circuit 104 provides the bias voltage $V_b$ to the gate of the first transistor 106 to control the word line voltage $V_{w1}$.

The use of a transistor-based diode as a biasing circuit to generate the bias voltage $V_b$ and assist in the read and write operations of the SRAM cell 102 ensures that the bias control circuit 104 occupies less area than conventional biasing circuits that include various combinations of transistors, resistors, diodes, and the like. Thus, the area occupied by the memory circuit 100 on the IC is less than the area occupied by semiconductor memory circuits that include conventional biasing circuits. Further, the power consumed by the memory circuit 100 is less than the power consumed by conventional semiconductor memory circuits.

The bias control circuit 104 regulates the SNM, the write margin, and the operational speed of the SRAM cell 102 by controlling the threshold voltages of the transistors 206-212. The use of the bias voltage $V_b$ to bias the body terminals of the transistors 206-212 ensures that the write margin and the SNM of the SRAM cell 102 are constant and above acceptable levels over a wide temperature range. This increases the efficiency of the read and write operations. Further, the write margin of the SRAM cell 102 is greater than the write margin of conventional SRAM cells with write assist circuits, especially at low temperatures. Further, an increase in the write margin of the SRAM cell 102 does not decrease the SNM of the SRAM cell 102 below an acceptable level, and vice-versa, thereby increasing the efficiency of the read and write operations.

The use of the bias voltage $V_b$ to bias the body terminals of the transistors 206-212 ensures that the operational speed of the SRAM cell 102 is greater than the operational speed of conventional SRAM cells with assist circuits, especially at low temperatures. Further, the voltage levels of the bias voltage $V_b$ vary very little over various process corners. Hence, the bias control circuit 104 may be used to generate the bias voltage $V_b$ for various process corners such as a fast or slow NMOS and fast PMOS transistor process corners, fast NMOS and slow PMOS transistors process corner, and a slow NMOS and fast PMOS transistors process corner.

The use of a temperature-dependent bias voltage $V_b$ to control the drive strengths of the transistors 206-212 improves alpha and beta ratios of the SRAM cell 102. The alpha ratio is a ratio of the drive strengths of the pass-gate transistors (such as the second and third pass-gate transistors 210 and 212) to the drive strengths of the pull-up transistors (such as the second and third pull-up transistors 202 and 204). The beta ratio is a ratio of the drive strengths of pull-down transistors (such as the second and third pull-down transistors 206 and 208) to the drive strengths of the pass-gate transistors. Further, as the operation of the SRAM cell 102 does not involve the use of negative voltages, fluctuations in the threshold voltages of transistors (such as the second and third pull-up, the second and third pull-down, and the second and third pass-gate transistors 202-212) within the SRAM cell 102 has very little effect, if any, on the write operation of the SRAM cell 102. Thus, the SRAM cell 102 is more reliable and consumes considerably less power than conventional SRAM cells with assist circuits.

It will be understood by those of skill in the art that the same functions may be performed by different arrangements of transistors that may operate using either high active or low active signals. Therefore, variations in the arrangement of some of the transistors described above should not be considered to depart from the scope of the present invention. No element, act, or instruction used in the present application should be construed as critical or essential to the invention unless explicitly described as such. Further, the phrase "based on" is intended to mean "based, at least in part, on" unless explicitly stated otherwise.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A semiconductor memory circuit, comprising:
    a memory cell that includes first and second pluralities of transistors, wherein the first plurality of transistors includes a plurality of pull-down transistors and at least one pass-gate transistor, the second plurality of transistors have body terminals connected to a supply voltage, and the second plurality of transistors includes a plurality of pull-up transistors;
    a bias control circuit for biasing the memory cell, wherein the bias control circuit is connected to body terminals of the first plurality of transistors for providing a bias voltage to control threshold voltages of the first plurality of transistors, wherein the bias voltage is generated based on junction leakages at the body terminals, and wherein the bias voltage is temperature-dependent;
    a word line connected to the memory cell, wherein the word line provides a word line voltage to the memory cell; and
    a third transistor having a gate terminal connected to the bias control circuit for receiving the bias voltage, a source terminal connected to the word line for receiving the word line voltage, a body terminal for receiving a supply voltage, and a drain terminal connected to ground, wherein the third transistor controls the word line voltage based on the bias voltage.

2. The semiconductor memory circuit of claim 1, wherein the bias control circuit includes a fourth transistor having source and body terminals connected to ground, and drain and gate terminals connected to the body terminals of the first plurality of transistors for providing the bias voltage.

3. The semiconductor memory circuit of claim 1, wherein the bias control circuit includes:
    a fifth transistor having a drain terminal connected to the body terminals of the first plurality of transistors for providing the bias voltage, a gate terminal for receiving a bias control voltage, and a body terminal connected to ground; and
    a sixth transistor having a drain terminal connected to a source terminal of the fifth transistor, a gate terminal connected to the drain terminal of the fifth transistor, and source and body terminals connected to ground.

4. A semiconductor memory circuit, comprising:
    a memory cell that includes first and second pluralities of transistors; and
    a bias control circuit for biasing the memory cell, wherein the bias control circuit is connected to body terminals of the first plurality of transistors for providing a bias voltage to control threshold voltages of the first plurality of transistors, wherein the bias voltage is generated based on junction leakages at the body terminals, and wherein the bias voltage is temperature-dependent wherein the bias voltage is higher for a first temperature than a second temperature, and wherein the first temperature is less than the second temperature.

5. A semiconductor memory circuit, comprising:
    a memory cell that includes first and second pluralities of transistors; and
    a bias control circuit for biasing the memory cell, wherein the bias control circuit is connected to body terminals of the first plurality of transistors for providing a bias voltage to control threshold voltages of the first plurality of transistors, wherein the bias voltage is generated based on junction leakages at the body terminals, and wherein the bias voltage is temperature-dependent, wherein the bias control circuit regulates a write margin and an operational speed of the memory cell by controlling the threshold voltages.

6. The semiconductor memory circuit of claim 1, wherein the memory cell is a six-transistor (6T) static random access memory (SRAM) cell.

7. A semiconductor memory circuit, comprising:
    a six-transistor (6T) static random access memory (SRAM) cell memory cell having first and second pluralities of transistors;
    a bias control circuit for biasing the memory cell, wherein the bias control circuit is connected to body terminals of the first plurality of transistors for providing a bias voltage to control threshold voltages of the first plurality of transistors, wherein the bias voltage is generated based on junction leakages at the body terminals, and wherein the bias voltage is temperature-dependent;
    a word line that provides a word line voltage to the memory cell, wherein the word line is connected to gates of pass-gate transistors of the first plurality of transistors; and
    a third transistor having a gate connected to the bias control circuit for receiving the bias voltage, a source connected to the word line for receiving the word line voltage, a body for receiving a supply voltage, and a drain connected to ground, wherein the third transistor controls the word line voltage based on the bias voltage.

8. The semiconductor memory circuit of claim 7, wherein the bias control circuit includes a fourth transistor having source and body terminals connected to ground, and drain and gate terminals connected to the body terminals of the first plurality of transistors for providing the bias voltage.

9. The semiconductor memory circuit of claim 7, wherein the bias control circuit includes:
    a fifth transistor having a drain terminal connected to the body terminals of the first plurality of transistors for providing the bias voltage thereto, a gate terminal that receives a bias control voltage, and a body terminal connected to ground; and
    a sixth transistor having a drain terminal connected to a source terminal of the fifth transistor, a gate terminal connected to the drain terminal of the fifth transistor, and source and body terminals connected to ground.

10. A method for biasing a memory cell, the memory cell including first and second pluralities of transistors, the method comprising:

generating, by a bias control circuit, a temperature-dependent bias voltage based on junction leakages at body terminals of the first plurality of transistors of the memory cell; and providing, by the bias control circuit, the bias voltage to the body terminals of the first plurality of transistors for controlling threshold voltages of the first plurality of transistors, wherein:
- the first plurality of transistors includes a plurality of pull-down transistors and at least two pass-gate transistors,
- the second plurality of transistors includes a plurality of pull-up transistors,
- the second plurality of transistors have body terminals that receive a supply voltage,
- a word line is connected to the memory cell for providing a word line voltage thereto, and
- gate terminals of the at least two pass-gate transistors of the first plurality of transistors are connected to the word line; and providing the bias voltage to a gate terminal of a third transistor, wherein a source terminal of the third transistor is connected to the word line for receiving the word line voltage, a drain terminal of the third transistor is connected to ground, and a body terminal of the third transistor is connected to body terminals of the second plurality of transistors and to a supply voltage, wherein the third transistor controls the word line voltage based on the bias voltage.

11. The method of claim 10, wherein the bias control circuit includes a fourth transistor having source and body terminals connected to ground, and drain and gate terminals connected to the body terminals of the first plurality of transistors.

12. The method of claim 10, wherein the bias control circuit includes:
- a fifth transistor having a drain terminal connected to the body terminals of the first plurality of transistors for providing the bias voltage, a gate terminal for receiving a bias control voltage, and a body terminal connected to ground; and
- a sixth transistor having a drain terminal connected to a source terminal of the fifth transistor, a gate terminal connected to the drain terminal of the fifth transistor, and source and body terminals connected to ground.

13. A method for biasing a memory cell, the memory cell including first and second pluralities of transistors, the method comprising:

generating, by a bias control circuit, a temperature-dependent bias voltage based on junction leakages at body terminals of the first plurality of transistors of the memory cell; and providing, by the bias control circuit, the bias voltage to the body terminals of the first plurality of transistors for controlling threshold voltages of the first plurality of transistors, wherein the bias voltage is higher for a first temperature than a second temperature, and wherein the first temperature is less than the second temperature.

14. A method for biasing a memory cell, the memory cell including first and second pluralities of transistors, the method comprising:

generating, by a bias control circuit, a temperature-dependent bias voltage based on junction leakages at body terminals of the first plurality of transistors of the memory cell; and providing, by the bias control circuit, the bias voltage to the body terminals of the first plurality of transistors for controlling threshold voltages of the first plurality of transistors, wherein the bias control circuit regulates a write margin and an operational speed of the memory cell by controlling the threshold voltages.

15. The semiconductor memory circuit of claim 4, wherein the memory cell is a six-transistor (6T) static random access memory (SRAM) cell.

16. The semiconductor memory circuit of claim 5, wherein the memory cell is a six-transistor (6T) static random access memory (SRAM) cell.

* * * * *